United States Patent
Beng et al.

(10) Patent No.: US 6,777,774 B2
(45) Date of Patent: Aug. 17, 2004

(54) LOW NOISE INDUCTOR USING ELECTRICALLY FLOATING HIGH RESISTIVE AND GROUNDED LOW RESISTIVE PATTERNED SHIELD

(75) Inventors: Sia Choon Beng, Singapore (SG); Yeo Kiat Seng, Singapore (SG); Sanford Chu, Singapore (SG); Lap Chan, Singapore (SG); Chew Kok-Wai, Singapore (SG)

(73) Assignee: Chartered Semiconductor Manufacturing Limited, Singapore (SG)

( * ) Notice: Subject to any disclaimer, the term of this patent is extended or adjusted under 35 U.S.C. 154(b) by 0 days.

(21) Appl. No.: 10/125,244

(22) Filed: Apr. 17, 2002

(65) Prior Publication Data

US 2003/0197243 A1 Oct. 23, 2003

(51) Int. Cl.[7] .............................................. H01L 29/00
(52) U.S. Cl. ...................................... 257/531; 438/329
(58) Field of Search ............................ 257/531; 438/329

(56) References Cited

U.S. PATENT DOCUMENTS 5,465,417 A * 11/1995 Tanbakuchi ................. 455/330
5,805,494 A * 9/1998 El-Kareh et al. ........... 365/149
5,930,638 A * 7/1999 Reedy et al. ............... 438/382

* cited by examiner

Primary Examiner—Nathan J. Flynn
Assistant Examiner—Scott R Wilson

(57) ABSTRACT

A novel complimentary shielded inductor on a semiconductor is disclosed. A region of electrically floating high resistive material is deposited between the inductor and the semiconductor substrate. The high resistive shield is patterned with a number of gaps, such that a current induced in the shield by the inductor does not have a closed loop path. The high resistive floating shield compliments a grounded low resistive shield to achieve higher performance inductors. In this fashion, noise in the substrate is reduced. The novel complimentary shield does not significantly degrade the figures of merit of the inductor, such as, quality factor and resonance frequency. In one embodiment, the grounded shield is made of patterned N-well (or P-well) structures. In still another embodiment, the low resistive electrically grounded shield is made of patterned Silicide, which may be formed on portions of the substrate itself.

31 Claims, 15 Drawing Sheets

Quality Factor and Inductance Plots of Unshielded Inductor and Inductor with Low Sheet Resistance Patterned Polysilicon Shield Quality Factor and Inductance Plots of Unshielded Inductor and Inductor with High Sheet Resistance Floating Polysilicon Shield

LOW NOISE INDUCTOR USING ELECTRICALLY FLOATING HIGH RESISTIVE AND GROUNDED LOW RESISTIVE PATTERNED SHIELD

FIELD OF THE INVENTION

The present claimed invention relates to the field of semiconductor processing. More particularly, the present claimed invention relates to a novel low noise on-chip inductor with a shield comprising a grounded low resistive material and an electrically floating high resistive material.

BACKGROUND ART

Increasing demands for personal mobile communication equipment have motivated recent research activities to focus on the development of inexpensive, small size, low power consumption and low noise level systems. Silicon, with its mature technology, low fabrication cost as well as high packing density is recognized as the only material able to satisfy the needs of this rapidly growing communication market. To fulfill all the above-mentioned requirements, one of the most important and indispensable circuit components is the on-chip silicon-based spiral inductor.

Advances in technology are making it possible to develop radio frequency (RF) circuits on a single silicon chip. In radio frequency operation, substrate induced noise inherent in the silicon technology is one of the main factors that limits achieving high performance low noise transceivers. Low Noise Amplifiers (LNA), being the first stage in the receiving path, are an important building block of a single-chip transceiver. The primary goal for the LNA is to minimize the noise figure of the receiver. However, in addition to RF noise from transistors, the thermal noise from the substrate resistance contributes significantly to the overall noise figure of the LNA. On-chip inductors, which are essential circuit components in building LNAs, VCOs etc., often generate significant amounts of such substrate noise that will degrade the overall circuit performance tremendously.

Several approaches that help reduce the effect of substrate thermal noise have been reported. However, all have significant problems. One conventional approach makes some improvements by introducing a ground shielded bonding pad structure (see, e.g., A. Rofougaran, J. Y. C. Chang, M. Rofougaran and A. A. Abidi, "A 1 GHz CMOS RF Front-End IC for a Direct Conversion Wireless Receiver, "IEEE Journal of Solid State Circuits, vol.31, pp880–889, 1996). Unfortunately, a ground shield produces a large pad to ground capacitance.

Another conventional technique uses thick polyimide inter-level dielectric underneath on-chip inductors (see, e.g., Y. Nakahara, H. Yano, T. Hirayama, Y. Suzuki and A. Furakawa, "Impact of interconnect Capacitance Reduction on RF-Si Device Performance, "IEDM Tech. Dig., pp861–864, 1999). Though significant results may be achieved, tedious, non-conventional and expensive processing steps are required with this method.

Hence, the key challenges for building on-chip silicon-based inductors lie not only in achieving high quality factor but also in fabricating inductors having low noise performance. For silicon-based inductors, it has been reported that having Silicide ground shields underneath the inductor improves its noise performance (see, e.g., H. Fujii, H. Suzuki, H. Yoshida and T. Yamazaki, "A0.15 µm/0.6 dB-Nfmin RF BiCMOS Technology using Cobalt Silicide Ground Shields," IEEE BCTM, pp98–101, 2000).

FIG. 1A illustrates a schematic cross section of an on-chip silicon-based inductor 110 without a ground shield. Conventional semiconductor processing uses a very conductive silicon substrate 102. Without any ground shield, the thermal noise in the substrate 102 may be substantial. FIG. 1B shows a cross section of an inductor 110 and a plate type ground shield 120 made of $CoSi_2$. FIG. 1C shows a ground shield patterned by trenches 130. Using a ground shield, however, leads to an unavoidable increase in the parasitic capacitance, which severely degrades the inductor's 110 performance.

FIG. 2 shows figures of merit for the inductors 110 of FIGS. 1A–1C. FIG. 2 shows the quality factor as a function of frequency for each case. As FIG. 2 shows, the quality factor is lower with the trench ground shield 130 when compared to the unshielded inductor. The quality factor is still lower with the plate shield 120. Furthermore, FIG. 2 shows that shielding the inductor 110 degrades the resonant frequency.

Referring now to FIG. 3A and FIG. 3B, one conventional method adds a patterned electrically grounded low sheet resistance polysilicon shield 320 between the inductor 110 and the substrate 102. Studies have been conducted to investigate inductors 110 with such patterned low sheet resistance polysilicon ground shields 320. FIG. 3A also shows an underpass 111 connected to the inductor 110 by vias 115. The semiconductor also comprises an inter-metal dielectric layer 322 and a field oxide layer 324. Unfortunately, this technique may lead to an increase in the parasitic oxide capacitance ($C_{ox}$). Effectively, this technique brings a new conductive silicon substrate (e.g., the polysilicon shield 320) which is electrically grounded and closer to the inductor 110 than the substrate 102. As seen, the substrate 102 has its own capacitance $C_{si}$ and resistance $R_{si}$. The capacitance $C_s$ between the inductor 100 spiral and underpass 110 is also shown.

Additionally, this configuration results in degradation in the inductor's performance. FIG. 4 shows a plot of the quality factor and inductance of an unshielded inductor with one shielded with low sheet resistance patterned polysilicon. As the graph shows, at 5 GHz there is considerable degradation of the quality factor. Additionally, above 4 GHz the inductance begins to rise significantly due to self resonance at high frequencies.

Thus, although low sheet resistance polysilicon or Silicide ground shields may improve the inductor's noise performance, the quality factor and resonant frequency are degraded.

As yet another concern, in order to achieve widespread acceptance, and to ensure affordability, any method of forming an on-chip silicon-based inductor, which overcomes the above-listed drawbacks, should be compatible with existing semiconductor fabrication processes.

Thus, a need exists for a shielded on-chip silicon-based inductor having low noise characteristics. A further need exists for such an inductor that does not have a significantly degraded quality factor. A further need exists for an inductor and a method for forming the inductor wherein the inductor and the formation method meet the above needs and are compatible with existing semiconductor fabrication processes such that significant revamping of semiconductor capital equipment is not required.

SUMMARY OF INVENTION

The present invention provides a shielded on-chip silicon-based inductors having a low substrate thermal noise. The present invention provides for such an inductor that does not have a significantly degraded quality factor. The present invention provides for an inductor and a method for forming the inductor wherein the inductor and the formation method meet the above needs and are compatible with existing semiconductor fabrication processes such that significant revamping of semiconductor capital equipment is not required.

A novel complimentary shielded inductor on a semiconductor is disclosed. The inductor is fabricated in one or more layers of a semiconductor. A region of electrically floating high sheet resistance material is deposited between the inductor and the semiconductor substrate. The high resistive shield is patterned with a number of gaps, such that a current induced in the shield by the inductor does not have a closed loop path. The high resistive floating shield compliments a grounded low resistive shield to achieve higher performance inductors. In this fashion, noise in the substrate is reduced. The novel complimentary shield does not significantly degrade the figures of merit of the inductor, such as, quality factor and resonance frequency.

In one embodiment, both the high resistive shield and the low resistive shield are patterned to prevent formation of eddy current in the shield. In one embodiment, the grounded low resistive shield, which may be made of silicided polysilicon, is aligned to cover the gaps of the high resistive shield, such that the inductor may not 'see' the substrate.

In one embodiment, the grounded shield is made of patterned N-well (or P-well) structures. The N-well structures may be aligned such that they compensate for the gaps in the electrically floating high resistive shield.

In still another embodiment, the low resistive electrically grounded shield is made of patterned Silicide, which may be formed on portions of the substrate itself. The substrate projects into a portion of a field oxide layer between the rest of the substrate and the high resistive shield. Thus, the low resistive shield is formed to block the gaps in the high resistive shield.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrates embodiments of the invention and, together with the description, serve to explain the principles of the invention.

The drawings referred to in this description should be understood as not being drawn to scale except if specifically noted.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
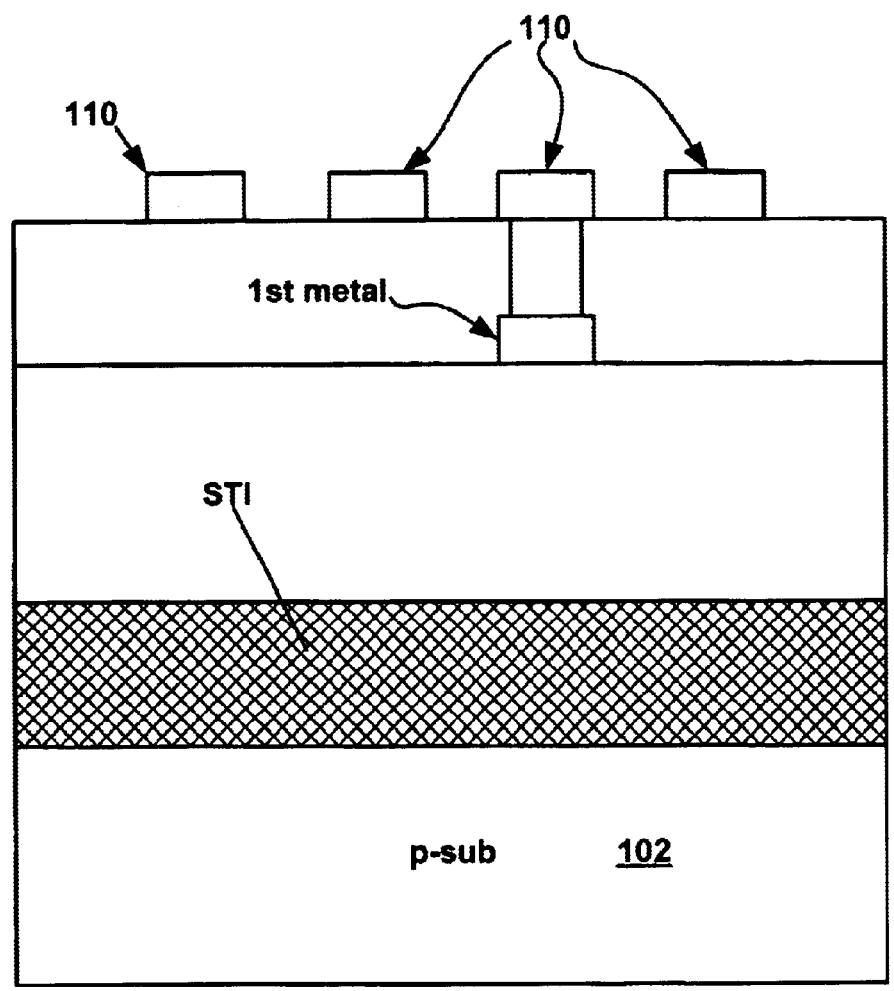
FIG. 1A is a side sectional view illustrating a conventional silicon based inductor above a substrate.
Figure 1B:
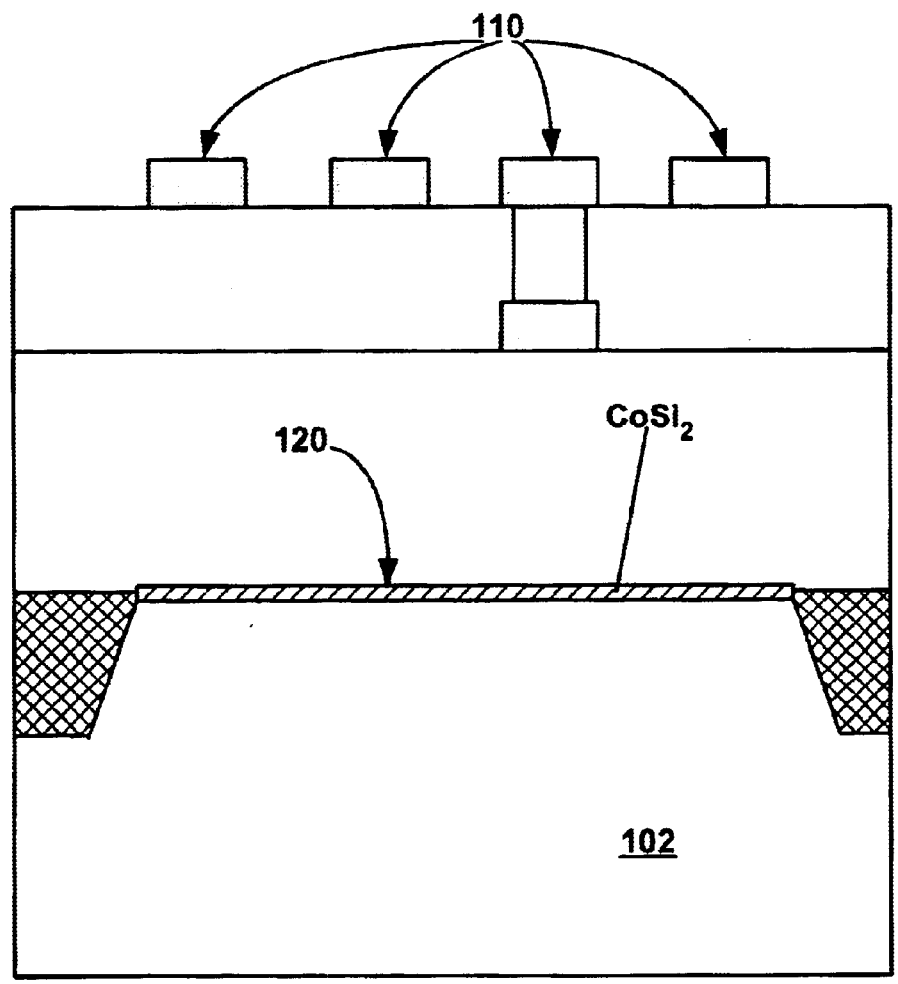
FIGS. 1B–1C are side sectional views illustrating conventional shields between an inductor and a substrate.
Figure 1C:
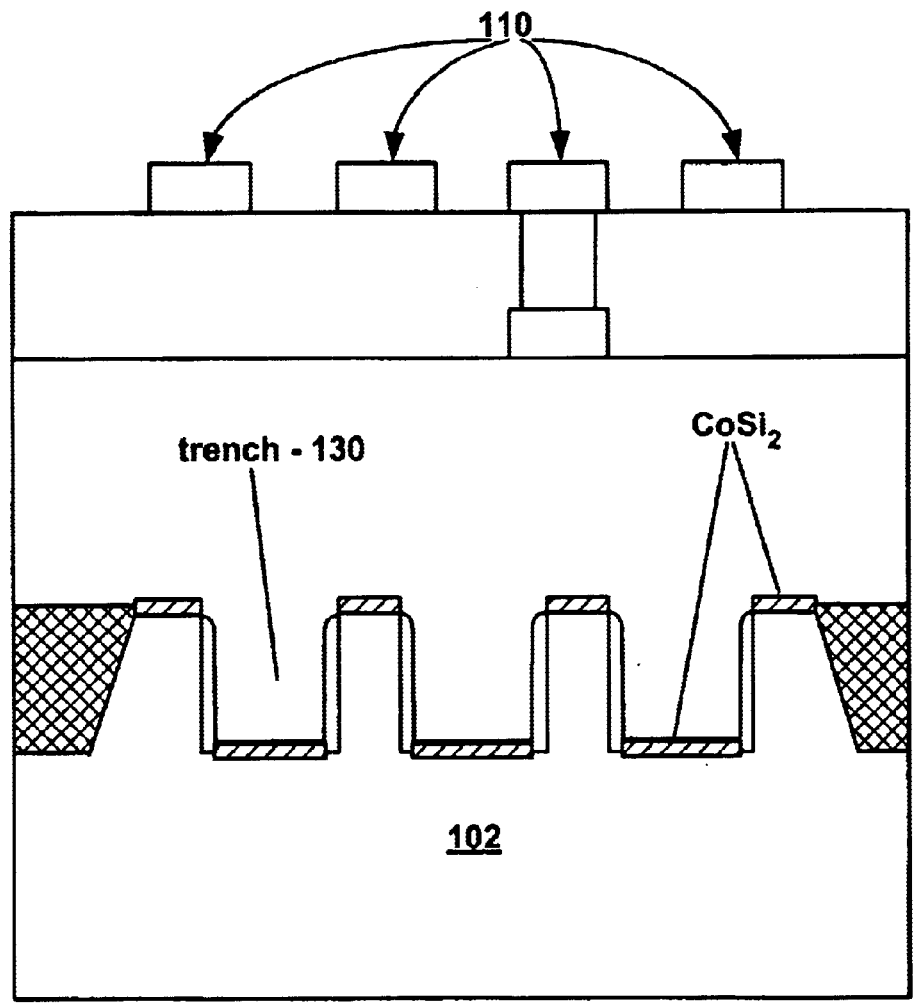
Figure 2:
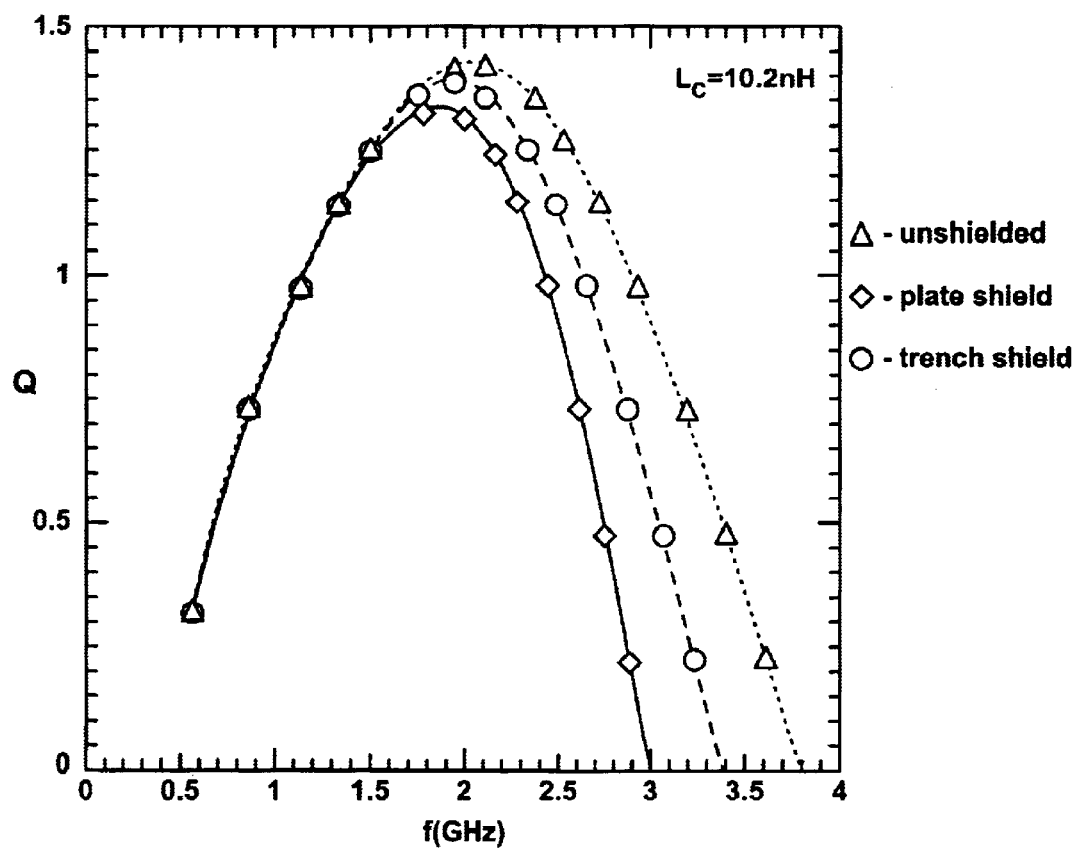
FIG. 2 is a graph illustrating the quality factor versus frequency for the conventional inductors of FIGS. 1A–1C.
Figure 3A:
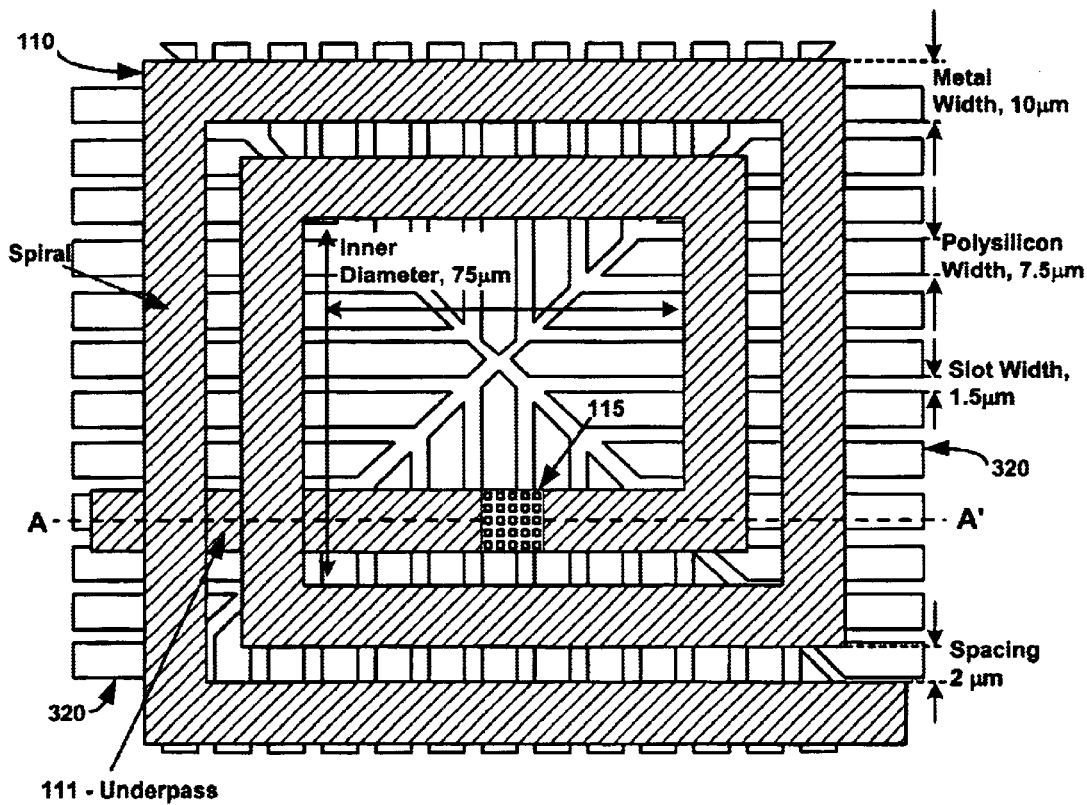
FIG. 3A is a top sectional view of a conventional square spiral inductor with a grounded low sheet resistance patterned polysilicon shield.
Figure 3B:
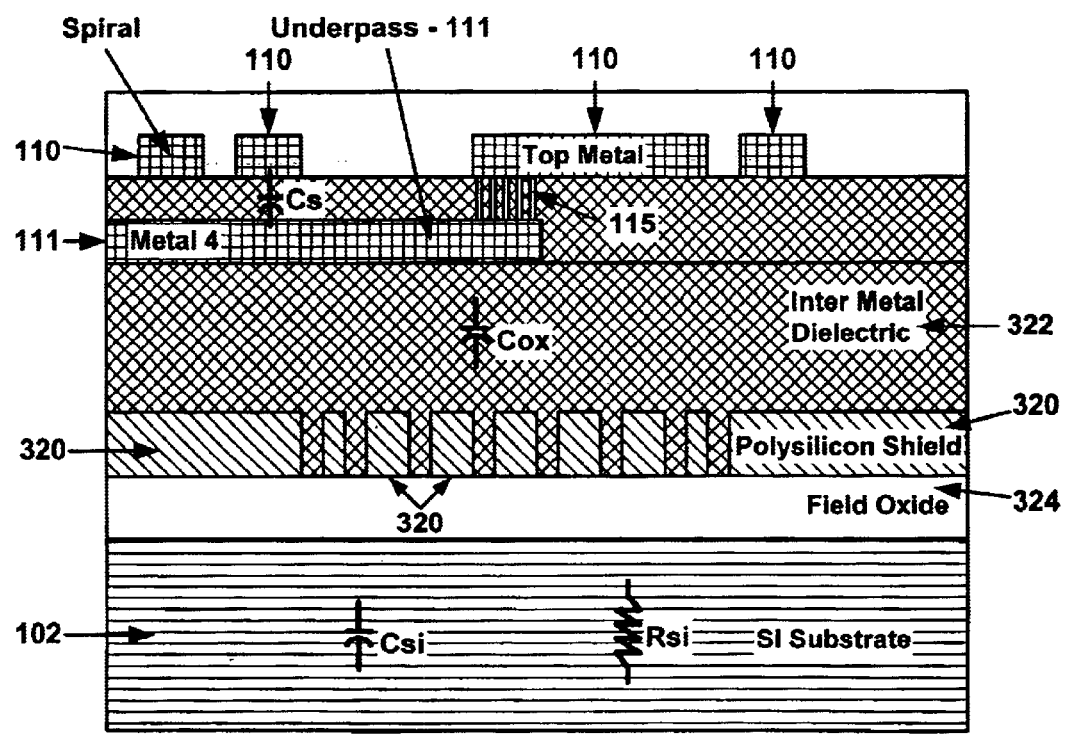
FIG. 3B is a side sectional view of the conventional square spiral inductor with a grounded low sheet resistance patterned polysilicon shield of FIG. 3A.
Figure 3C:
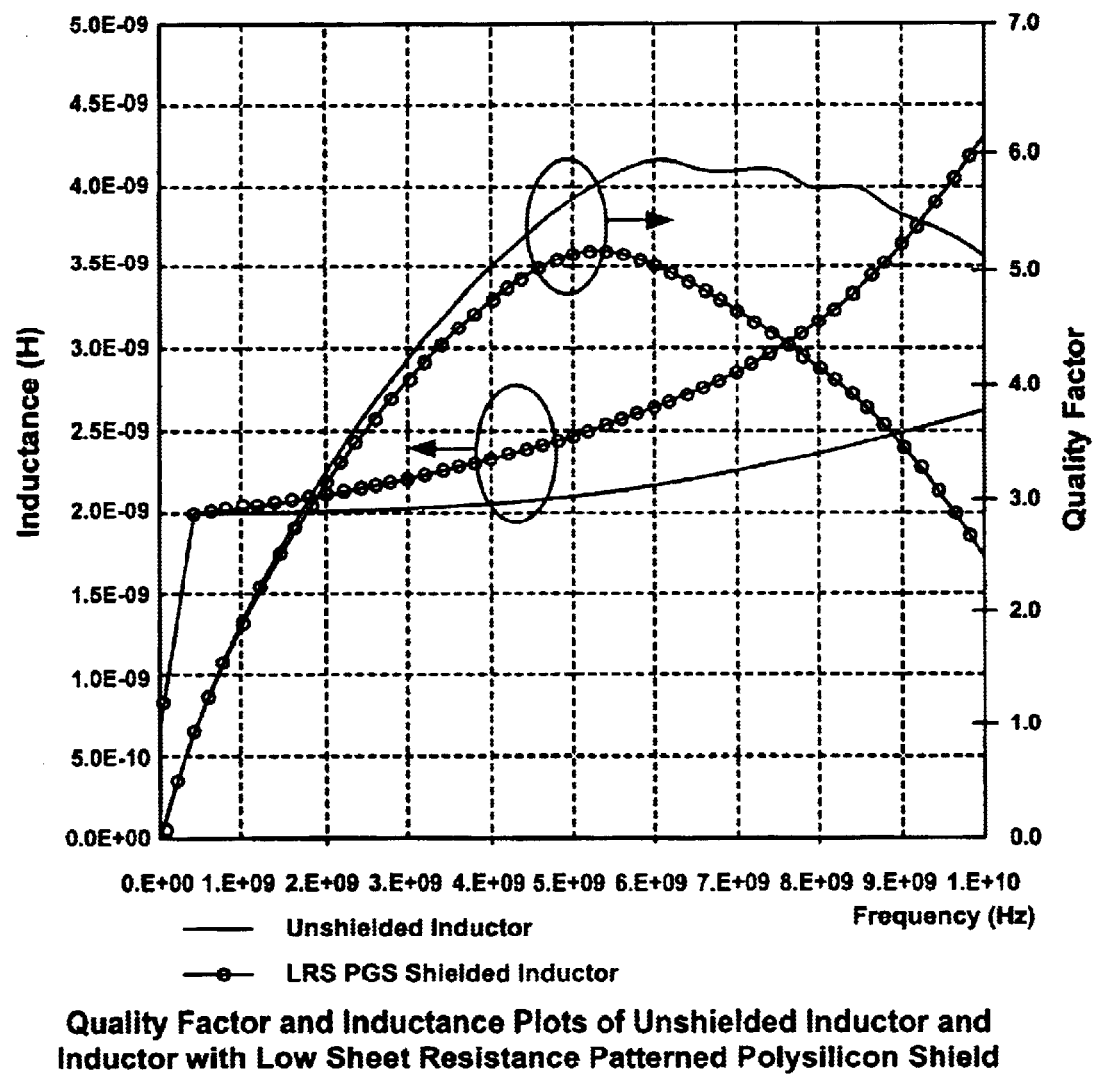
FIG. 3C is a graph illustrating quality factor and inductance versus frequency for a conventional unshielded inductor and the conventional inductor of FIGS. 3A and 3B.
Figure 4:
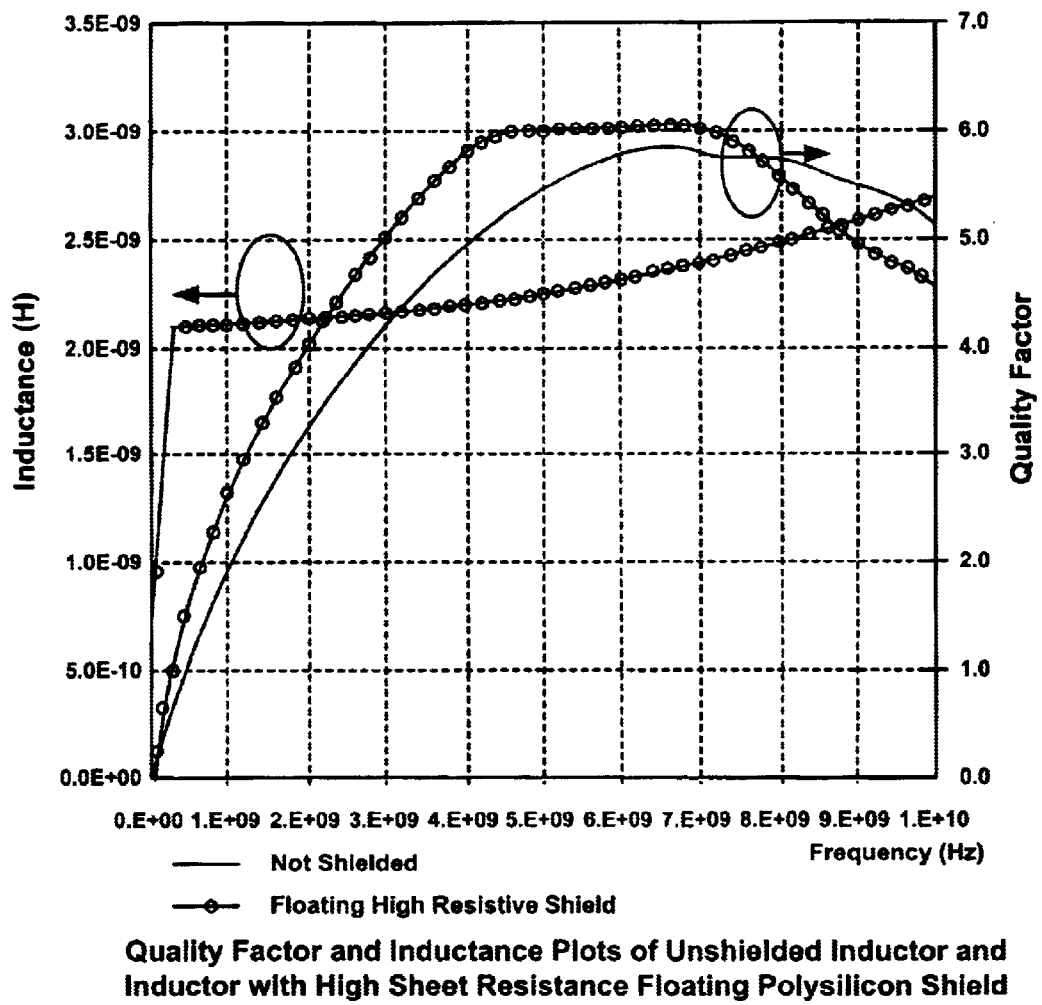
FIG. 4 is a graph illustrating improved quality factor for an inductor having a high sheet resistance floating shield over an unshielded inductor, in accordance with embodiments of the present claimed invention.

Embodiments of the present invention provide for a complimentary shield of a both a floating high resistive shield and a grounded low resistive shield between the inductor and the substrate. However, the present invention is not limited to using both the high and low resistive shield; in one embodiment, only a floating high resistive shield is used. When a floating high sheet resistance patterned polysilicon shield is fabricated underneath the inductor, an improvement in quality factor is observed. Referring to FIG. 4, the improvement in the quality factor is seen for a case in which only a floating high resistive shield is used. In contrast to the prior art case which used only a grounded low sheet resistance shield seen in FIG. 3C, the floating high resistive shield shows an improvement in quality factor even at low frequencies. The floating high resistive shield may be used to compliment an inductor with only a grounded low resistive shield that has good noise performance.

Figure 5A:
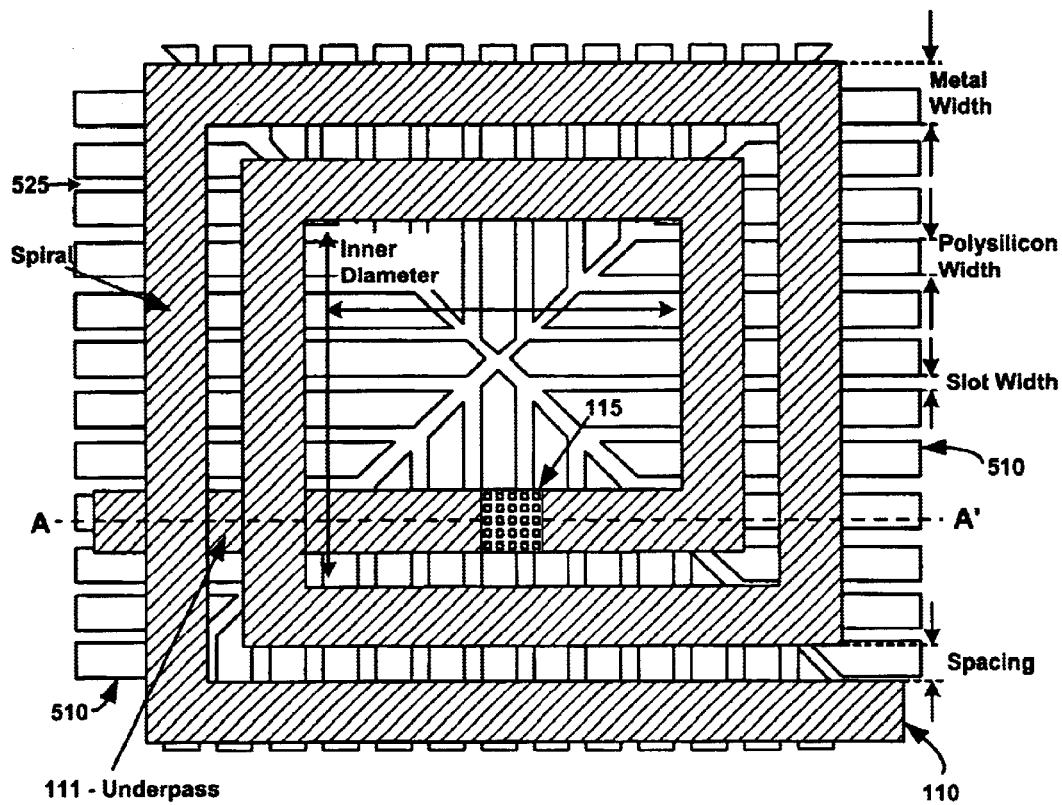
FIG. 5A is a top sectional view of a square spiral inductor with a complimentary shield that comprises both a floating high resistive patterned polysilicon material and a grounded low resistive material, in accordance with embodiments of the present claimed invention.
Figure 5B:
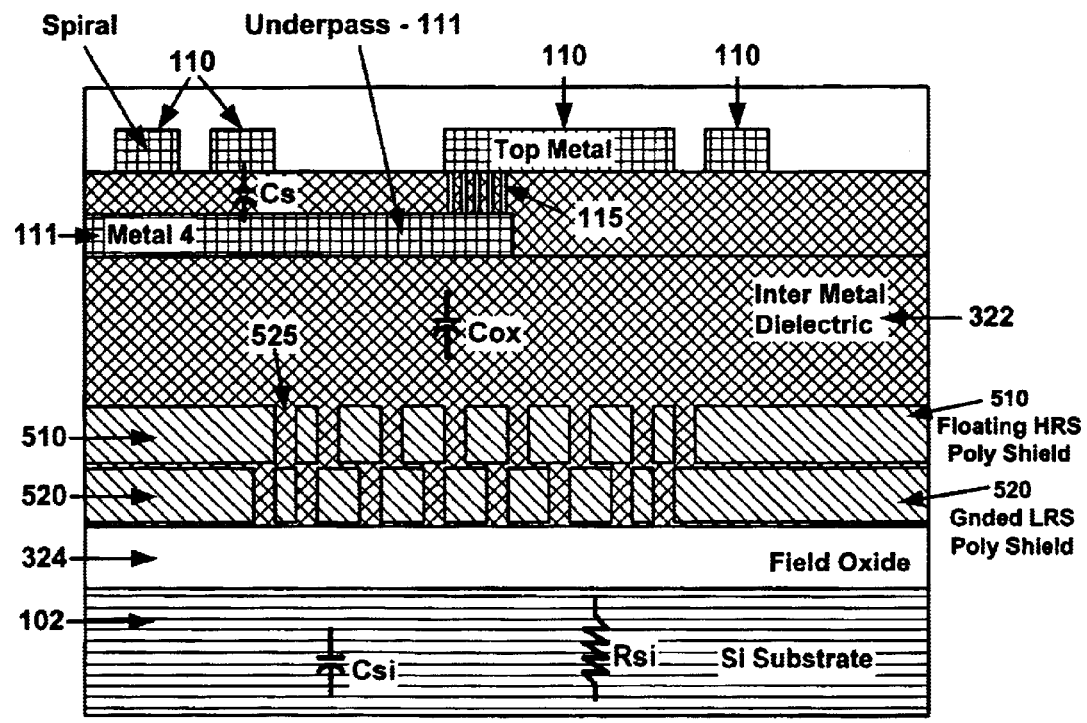
FIG. 5B is a side sectional view of the square spiral inductor of FIG. 5A, in accordance with embodiments of the present claimed invention.

Referring now to FIG. 5A and FIG. 5B, an embodiment provides for an electrically floating high resistive shield 510. The high resistive shield 510 is preferably non-metallic and should be an electrical insulator. In one embodiment, the high resistive shield 510 comprises lightly doped unsilicided polysilicon. Preferably, the high resistive shield 510 may have a sheet resistance of greater than 10,000 Ohms per square, although embodiments with lower resistances may also be suitable.

FIG. 5B is taken along line AA' of the top sectional view of FIG. 5A. The views show a square spiral inductor 110. However, the present invention is not limited to such inductors. In general, embodiments may be used with any element for which shielding is desired, including, but not limited to, circular, polygonal, spiral, or stacked inductors, etc. The inductor may be made of any material, including, but not limited to aluminum and copper.

The inductor 110 has an underpass 111, which may be connected to the spiral by vias 115. Embodiments have a floating high resistive shield 510 in an inter metal dielectric 322 between the inductor 110 and the substrate 102. There may also be a field oxide region 324 between the floating high resistive shield 510 and the substrate 102.

In a preferred embodiment, an electrically grounded low resistive shield 520 resides below the floating high resistive shield 510. This shield 520 may provide a terminating path for the inductor electric field (e.g., a short). The low resistive shield 520 may be made of highly doped silicided polysilicon, although this is not required. In one embodiment, the low resistive shield 520 may have a sheet resistance of a few Ohms per square, although a wide range is suitable. The ratio of the resistance of the high resistive shield 510 to the low resistive shield 520 may be on the order of 1000; however, other ratios are suitable. Furthermore, the present invention is not limited to using both shields. In one embodiment, only the electrically floating high resistive shield 510 is used. Furthermore, the present invention is not limited to the particular orientation of the two shields. In another embodiment, the electrically grounded low resistive shield 520 resides above the electrically floating high resistive shield 510.

The patterning of the shields 510, 520 may be configured in a non-continuous fashion such that a current induced in the shield 510, 520 by the inductor 110 will not have a closed loop path. It may also be stated that the shields 510, 520 are patterned to prevent formation of eddy currents in the shields 510, 520. Thus, in one embodiment, the pattern may be composed of a number of segments with a slot or gap 525 between them. In one embodiment, the segments have a width on the order of 10 microns and the slots or gaps 525 have a width on the order of 1 micron. However, the present invention is not limited to these widths. Furthermore, the present invention is not limited to patterned shields 510, 520. Thus, embodiments with full shields without patterning may be suitable.

With only one shield, the inductor 102 may be able to 'see' through to the substrate 102. Beneficially, an embodiment uses two shields such that where one shield has a gap 525 the other does not and vice versa. In this fashion, the inductor 110 cannot 'see' the substrate 102. Thus, the electric field is substantially blocked in that it does not have an open path through a gap 525 in a shield 510, 520.

For illustrative purposes, the graph of FIG. 4 is based on the following parameters. However, the present invention is not limited to these parameters. The inductor 110 may be a 3.5-turns conventional square spiral inductor, fabricated on Chartered Semiconductor Manufacturing Ltd's 0.25 $\mu$m logic baseline process with plug-in analog modules. The spiral may consist of the topmost metal with a thickness of 0.6 $\mu$m. For the underpass 111, a 0.5 $\mu$m thick aluminum may be used to contact the center of the spiral. The inter-metal dielectric 322 thickness between the spiral 110 and high resistive shield 510 may be about 5.0 $\mu$m. Field oxide 324 sandwiched by the low resistive shield 520 and substrate may be 0.36 $\mu$m in thickness. The inductor 110 may have an inner diameter of 75.0 $\mu$m and its width and spacing may be 10.0 $\mu$m and 2.0 $\mu$m respectively. Polysilicon strips with a fixed width of 7.5 $\mu$m and a slot width of 1.5 $\mu$m may be used to construct the entire low resistive ground shield 520 as well as electrically floating high resistive shield 510. The ground low resistive shield 520 may use strips of very low resistive silicided polysilicon. The electrically floating high resistive shield 510 may achieve behavior of an opened substrate by exploiting un-doped polysilicon with a high sheet resistance to mimic high resistive silicon.

Figure 6A:
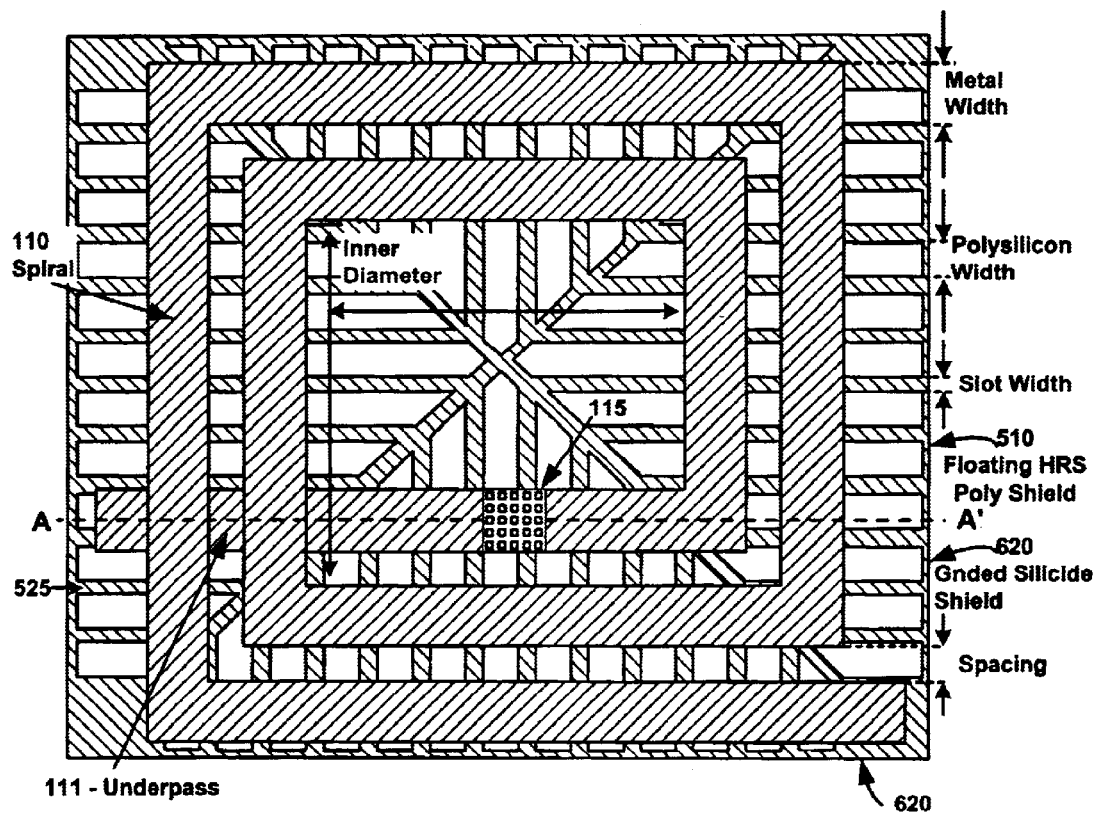
FIG. 6A is a top sectional view of a square spiral inductor with a floating high sheet resistance patterned polysilicon shield and a grounded Silicide shield, in accordance with embodiments of the present claimed invention.
Figure 6B:
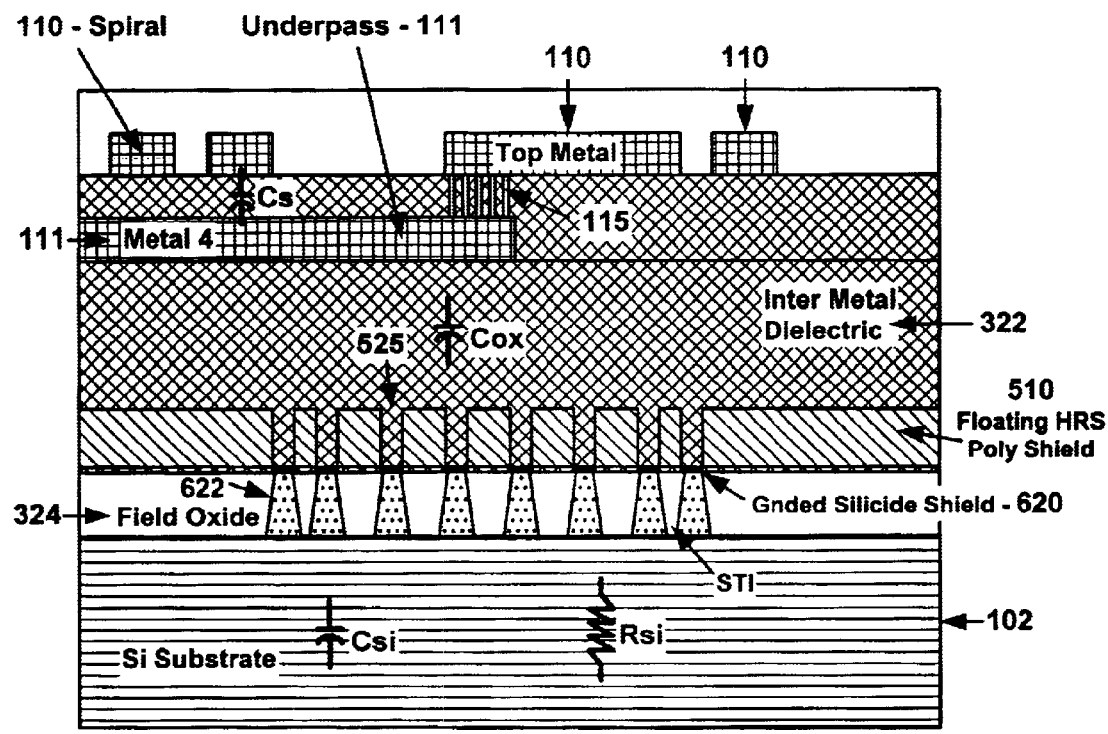
FIG. 6B is a side sectional view of the square spiral inductor with shield of FIG. 6A, in accordance with embodiments of the present claimed invention.

Referring now to FIG. 6A and FIG. 6B, one embodiment uses an electrically grounded Silicide shield 620 instead of an electrically grounded patterned shield 520. Preferably, the electrically grounded Silicide shield 620 is low resistance to provide a terminating path to ground for the electric field of the inductor 110. The electrically grounded Silicide shield 620 may be, for example, Platinum Silicide, Titanium Silicide, or the like. Silicide is selected because it is a convenient material to work with. However, other materials may be used here, as well.

In this embodiment, shallow trench isolation (STI) is used to construct projections 622 of substrate 102 upon which the electrically grounded Silicide shield 620 is placed. The Silicide shield 620 may be patterned. The substrate 102 regions within the field oxide 324 are a consequence of the semiconductor fabrication method. Advantageously, this and other embodiments are well suited to be used in existing semiconductor fabrication methods.

The electrically grounded low resistive shield 620 is placed below the gaps 525 of the electrically floating high resistive shield 510. In this fashion, the electrically grounded Silicide shield 620 serves to provide a terminating path for portion of the electric field of the inductor 110 that may pass through the gaps 525 of the electrically floating high resistive shield 510.

Figure 7A:
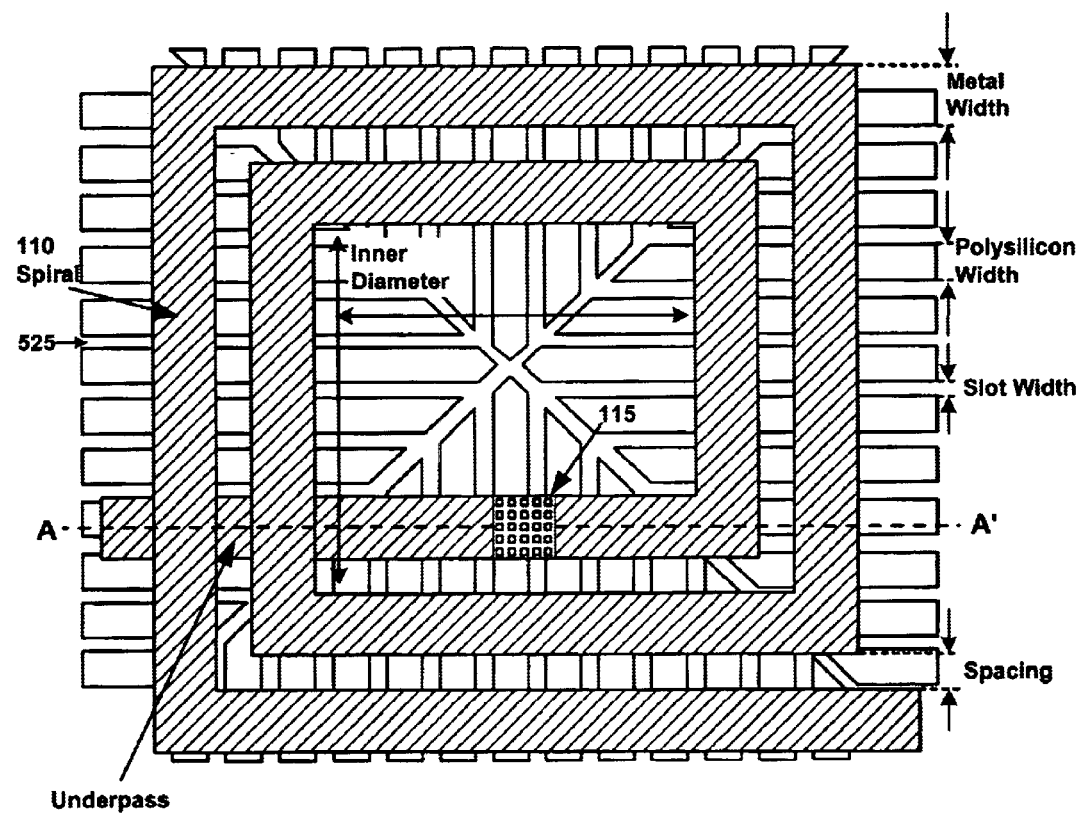
FIG. 7A is a top sectional view of a square spiral inductor with a floating high sheet resistance patterned polysilicon shield and a grounded N-well shield, in accordance with embodiments of the present claimed invention.
Figure 7B:
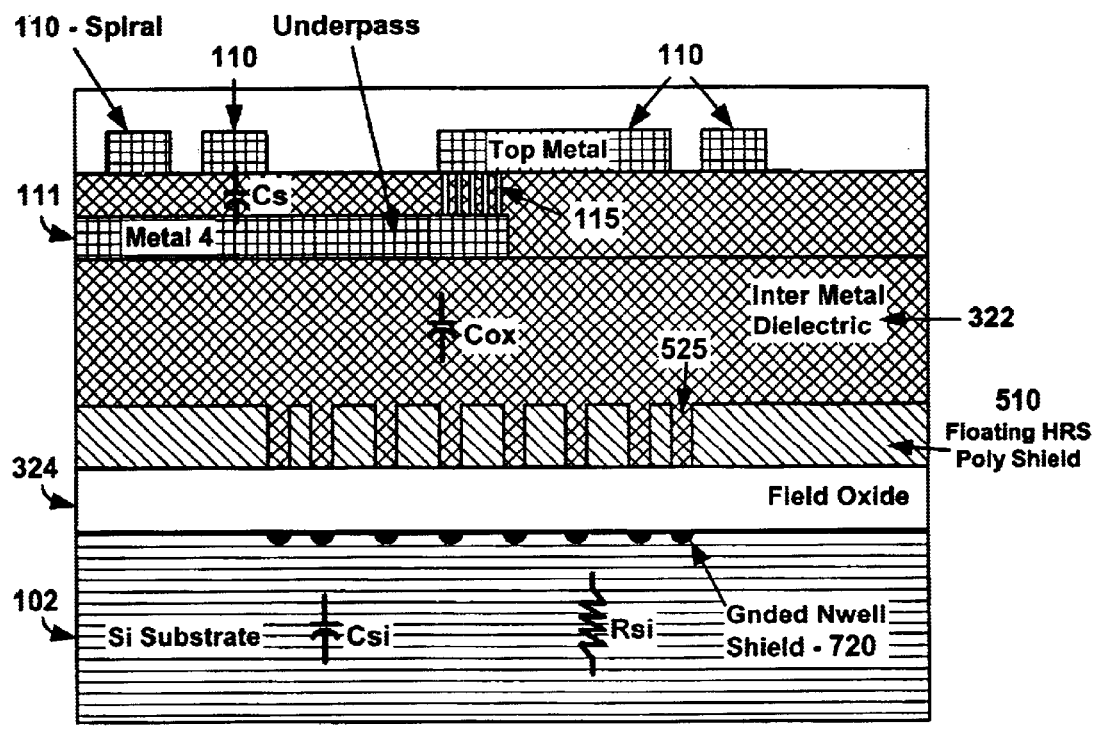
FIG. 7B is a side sectional view of the square spiral inductor with shields of FIG. 7A, in accordance with embodiments of the present claimed invention.

Referring to FIG. 7A and FIG. 7B, another embodiment uses an electrically grounded N-well (or P-Well) shield 720. The grounded N-well shield 720 may be patterned. In one embodiment, electrically grounded N-well shields 720 are formed in the p-substrate 102. Alternatively, P-well shields may be formed in a n-substrate 102. The well shields 720 are formed near the top surface of the substrate 102 and may be positioned such that they are aligned with the gaps 525 in the electrically floating high resistive shield 510. By using electrically grounded N-well (or P-well) structures as the bottom shield, parasitic capacitance is minimized. A guard-ring-like structure with N+ or P+ contacts may be used to ground the N-well or P-well shield 720.

Figure 8:
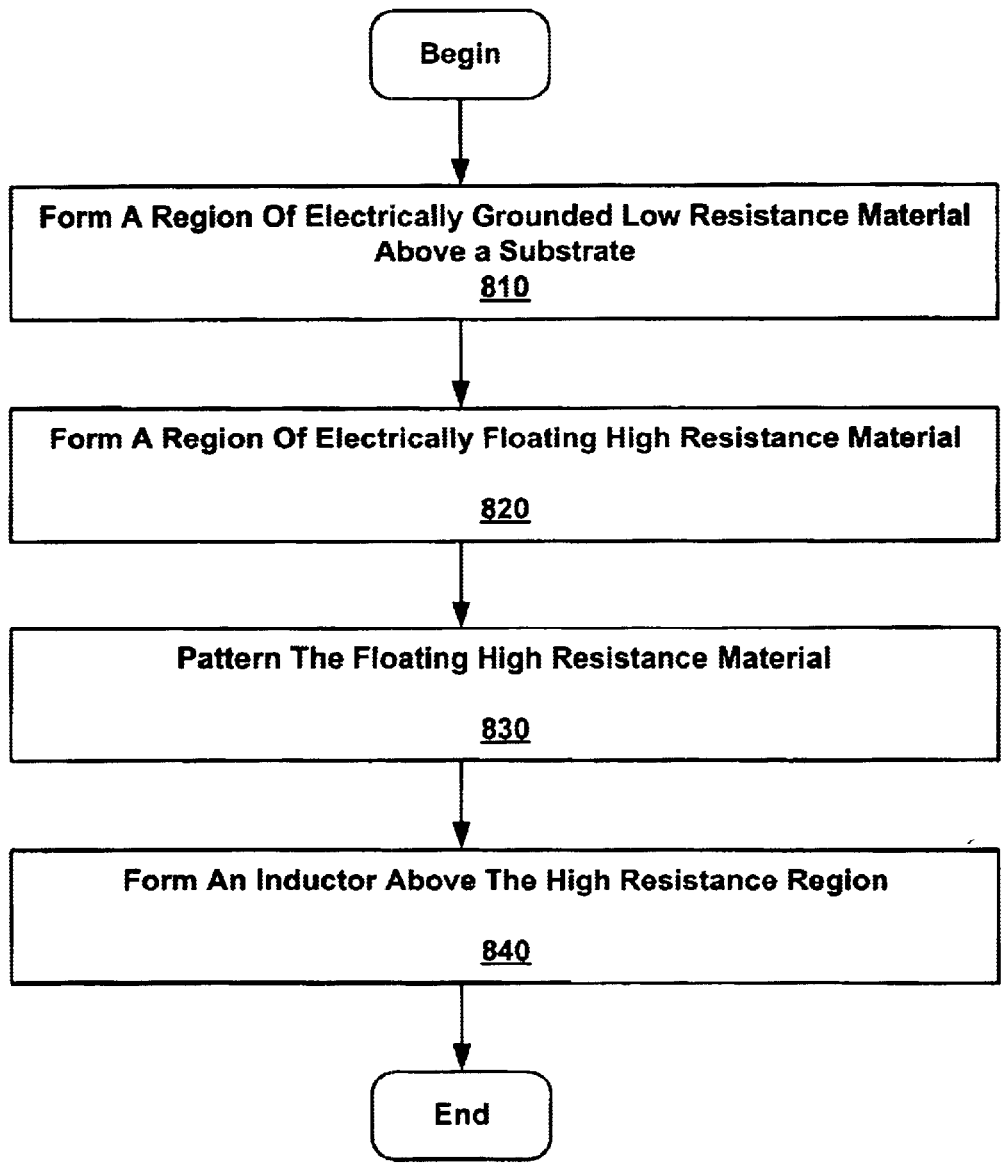
FIG. 8 is a flowchart illustrating the steps of a process of forming a shielded inductor, in accordance with embodiments of the present claimed invention.

Referring now to FIG. 8, an embodiment provides for a method of forming a silicon-based shielded inductor 110. In step 810, a region of electrically grounded low sheet resistance material is formed above a substrate 102. The low sheet resistance material may be a patterned low resistive shield 520, a Silicide shield 620 formed on projections 622 of substrate 102, or an N-well shield 720.

In one embodiment, step 810 comprises forming projections 622 of substrate 102 into a field oxide layer 324 above the rest of the substrate 102 by using a shallow trench isolation (STI) process. The electrically grounded low resistive shield 620 is then formed on top of the projections 622. The shield 620 may be made of Titanium Silicide, Platinum Silicide, etc.

In step 820, a region of electrically floating high resistive material 510 is formed above the electrically grounded low resistive material (520, 620, 720). The high resistive material 510 may be made of un-doped silicon, for example, or other materials discussed herein.

In step 830, the high resistive material is patterned. In this fashion, induced currents do not have a closed loop path.

In step 840, an inductor 110 is formed above the electrically floating high resistive shield 510. The present invention is well-suited to a wide variety of inductors, including, but not limited to circular spiral, square spiral, stacked, etc.

By utilizing both a low resistive ground shield 520 as well as high sheet resistive electrically floating polysilicon shield 510, a low noise and high performance inductor 110 with an improved quality factor can be easily achieved. More importantly, there are no complicated or additional processing steps involved, and the new inductor design can be implemented easily in all current CMOS and BiCMOS technologies. Beneficially, the structures and formation methods of the present embodiments are realized using existing semiconductor fabrication processes such that significant revamping of semiconductor capital equipment is not required. As a result, the present embodiments do not require significant costs to implement.

Thus, the invention provides for a shielded silicon based inductor having low substrate thermal noise. The invention provides for such an inductor that does not have a significantly degraded quality factor. The invention provides for such an inductor fabricated in a semiconductor in such as fashion as to not increase the parasitic capacitance. The invention provides for an inductor and a method for forming the inductor wherein the inductor and the formation method meet the above needs and are compatible with existing semiconductor fabrication processes such that significant revamping of semiconductor capital equipment is not required.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

We claim:

1. A shield for reducing electromagnetic effects generated in a semiconductor, said shield comprising:
   a) an electrically floating high resistive material in said semiconductor, said high resistive material patterned to prevent current induced in said high resistive material from having a closed loop path, said pattern having a plurality of gaps; and
   b) a grounded low resistive material in said semiconductor, said low resistive material being substantially adjacent said gaps.

2. The shield of claim 1 wherein said high resistive material is an electrical insulator.

3. The shield of claim 1 wherein said high resistive material comprises high sheet resistance silicon.

4. The shield of claim 1 wherein said high resistive material has a resistance of greater than 10,000 Ohms.

5. The shield of claim 1 wherein said semiconductor comprises:
   a substrate;
   an inter-metal dielectric disposed between said substrate and said high resistive material; and
   said substrate comprises projections into said inter-metal dielectric upon which said low resistive material is formed, wherein said low resistive material is operable to substantially prevent an electromagnetic field from passing through to said substrate.

6. The shield of claim 5 where said low resistive material comprises polysilicon.

7. The shield of claim 1 wherein said low resistive material comprises a well structure.

8. The shield of claim 7 wherein said low resistive material comprises an N-well structure.

9. The shield of claim 7 wherein said low resistive material comprises a P-well structure.

10. The shield of claim 1 wherein said high resistive material is non-metallic.

11. The shield of claim 1 wherein said semiconductor comprises an element that is operable to generate electromagnetic energy, wherein said shield is operable to substantially reduce electromagnetic effects from said element in a substrate of said semiconductor.

12. The shield of claim 1 wherein said semiconductor comprises an inductor.

13. A shielded silicon based inductor, comprising:
   an inductor formed in a semiconductor; and
   an electrically floating high resistive material disposed between said inductor and a substrate, said high resistive material having a pattern that is non-continuous such that current induced in said high resistive material from said inductor faces an open loop path, wherein said high resistive material has gaps.

14. The shielded silicon based inductor of claim 13, further comprising:
   an electrically grounded low resistive material between said inductor and said substrate, said low resistive material being substantially adjacent said gaps.

15. The shielded silicon based inductor of claim 14 wherein the ratio of resistivity between said high resistive material and said low resistive material is at least 1000.

16. The shielded silicon based inductor of claim 13 wherein said high resistive material comprises lightly doped unsilicided polysilicon.

17. The inductor of claim 14 wherein said semiconductor comprises:
   an inter-metal dielectric disposed between said substrate and said high resistive material; and
   said substrate comprises projections into said inter-metal dielectric upon which said low resistive material is formed, wherein said low resistive material is operable to substantially prevent an electromagnetic field from passing through to said substrate.

18. The inductor of claim 17 where said low resistive material comprises highly doped silicided polysilicon.

19. The inductor of claim 14 wherein said low resistive material comprises a well structure.

20. The inductor of claim 19 wherein said low resistive material comprises an N-well structure.

21. The inductor of claim 13 wherein said inductor comprises a spiral shape.

22. The inductor of claim 13 wherein said inductor comprises a spiral of substantially concentric rectangles.

23. The inductor of claim 13 wherein said inductor comprises a stacked formation.

24. The inductor of claim 13 wherein said inductor comprises copper.

25. The inductor of claim 13 wherein said inductor comprises aluminum.

26. The inductor of claim 13 wherein said high resistive material is substantially non-conducting.

27. A shielded silicon based inductor, comprising:

an inductor formed in a semiconductor;

an electrically floating high resistive material disposed between said inductor and a substrate; and an electrically grounded low resistive material between said inductor and said substrate.

28. The shielded silicon based inductor of claim 27 wherein further comprising:

a substrate;

an inter-metal dielectric disposed between said substrate and said high resistive material; and said substrate comprises projections into said inter-metal dielectric upon which said low resistive material is found.

29. The shielded silicon based inductor of claim 28 where said low resistive material comprises silicided polysilicon.

30. The shielded silicon based inductor of claim 27 wherein said low resistive material comprises a well structure.

31. The shielded silicon based inductor of claim 27 wherein said inductor is polygonal shaped.

* * * * *